(12) United States Patent
Stasiak et al.

(10) Patent No.: US 7,608,194 B2
(45) Date of Patent: Oct. 27, 2009

(54) PHOTONIC STRUCTURES, DEVICES, AND METHODS

(75) Inventors: James Stasiak, Lebonon, OR (US); David Champion, Lebonon, OR (US); Kevin Peters, Corvallis, OR (US); Donald J. Coulman, Corvallis, OR (US); Tony S. Cruz-Uribe, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 178 days.

(21) Appl. No.: 11/774,397

(22) Filed: Jul. 6, 2007

(65) Prior Publication Data
US 2008/0014353 A1    Jan. 17, 2008

Related U.S. Application Data

(62) Division of application No. 10/755,955, filed on Jan. 12, 2004, now Pat. No. 7,255,805.

(51) Int. Cl.
*B05D 1/32* (2006.01)
*C23F 1/00* (2006.01)

(52) U.S. Cl. .......................... 216/41; 216/52

(58) Field of Classification Search .................... None
See application file for complete search history.

(56) References Cited

U.S. PATENT DOCUMENTS

| | | | |
|---|---|---|---|
| 5,172,267 A | 12/1992 | Yablonovitch | |
| 5,335,240 A | 8/1994 | Ho et al. | |
| 5,406,573 A | 4/1995 | Ozbay et al. | |
| 5,440,421 A | 8/1995 | Fan et al. | |
| 5,600,483 A | 2/1997 | Fan et al. | |
| 5,651,818 A | 7/1997 | Milstein et al. | |
| 5,772,905 A | 6/1998 | Chou | |
| 5,997,795 A | 12/1999 | Danforth et al. | |
| 5,998,298 A | 12/1999 | Fleming et al. | |
| 6,139,626 A | 10/2000 | Norris et al. | |
| 6,309,580 B1 | 10/2001 | Chou | |
| 6,358,653 B1 | 3/2002 | Turberfield et al. | |
| 6,358,854 B1 | 3/2002 | Fleming et al. | |
| 6,392,787 B1 | 5/2002 | Cirelli et al. | |
| 6,468,823 B1 | 10/2002 | Scherer et al. | |

(Continued)

FOREIGN PATENT DOCUMENTS

EP    10 729 54    1/2001

(Continued)

OTHER PUBLICATIONS

Johnson, "Nanolith effort harnesses . . . " EETimes Aug. 5, 2003 http://www.eetimes.com/story/OEG2003080550035.

(Continued)

*Primary Examiner*—Allan Olsen

(57) ABSTRACT

Photonic crystal structures are made by a method including steps of providing a substrate, depositing at least one planar layer to form a stack, each planar layer of the stack comprising two or more sublayers having different sublayer refractive indices, depositing a hard mask material, depositing an imprintable material over the hard mask material, patterning the imprintable material by imprinting an array of depressions, and directionally etching at the depressions a regular array of openings through the hard mask material and the stack.

5 Claims, 5 Drawing Sheets

U.S. PATENT DOCUMENTS

| | | | |
|---|---|---|---|
| 6,469,682 | B1 | 10/2002 | De Maagt et al. |
| 6,482,742 | B1 | 11/2002 | Chou |
| 6,517,995 | B1 | 2/2003 | Jacobson et al. |
| 6,518,189 | B1 | 2/2003 | Chou |
| 7,344,903 | B2 * | 3/2008 | Erchak et al. ............ 438/29 |
| 2002/0045136 | A1 | 4/2002 | Fritze et al. |
| 2002/0062782 | A1 | 5/2002 | Norris et al. |
| 2002/0079497 | A1 | 6/2002 | Gopinath |
| 2002/0115002 | A1 | 8/2002 | Bailey et al. |
| 2002/0154403 | A1 | 10/2002 | Trotter, Jr. |
| 2002/0159126 | A1 | 10/2002 | Sigalas |
| 2002/0167118 | A1 | 11/2002 | Billiet et al. |
| 2003/0141507 | A1 | 7/2003 | Krames et al. |
| 2004/0214427 | A1 | 10/2004 | Kloster |
| 2007/0045640 | A1 * | 3/2007 | Erchak et al. ............ 257/98 |
| 2008/0292976 | A1 * | 11/2008 | Terasaki et al. ............ 430/5 |

FOREIGN PATENT DOCUMENTS

| | | | |
|---|---|---|---|
| JP | 2000-258650 | A | 9/2000 |
| JP | 2000-284136 | A | 10/2000 |
| JP | 2000-314817 | A | 11/2000 |
| JP | 2002-323631 | A | 11/2002 |
| JP | 2002-323632 | A | 11/2002 |

OTHER PUBLICATIONS

Anon. "UV based Nanoimprint Lithography" http://www.amo.de/amica/nanoimprint.html (date unknown).

Sreenivasan "Nanoimprint Lithography . . . " http://www.nnf.cornelledu/JapanUS/SreenivasanJUSSSymposium (date unknown).

Lammers, "Nanoimprint lithography ready . . . "Dec. 2, 2002 http://www.eetimes.com/at/news/OEG20021220S0022.

Hewitt, "Moulds cut photonic crystal costs" May 16, 2002 http://nanotechweb.org/articles/news/1/5/8/1.

Fleming et al. "All-metallic three-dimensional photonic . . . " Nature, V. 417 (May 2, 2002), pp. 52-55.

Service "Building Better Photonic Crystals" Science, V. 295 (Mar. 29, 2002) p. 2399.

Frenkel "Playing Tricks with Designer 'Atoms'" Science, V. 296 (Apr. 5, 2002) pp. 65-66.

Anon."Si-based photonic . . . " http//fisicavolta.unipv.it/dipartimento/ricerca/fotonici/ Cofin . . . pdf (date unknown).

Vlasov et al. "On-chip natural assembly of silicon photonic . . . " Nature V.414 (Nov. 15, 2001) pp. 289-293.

Lin et al."Silicon Three-dimensional Photonic . . . " Sandia National Lab report SAND2002-3612 (Nov. 2001).

Gasser et al. "Real-Space Imaging . . . " Science V. 292 (Apr. 13, 2001) pp. 258-262.

Norris et al. "Chemical Approaches to Three-Dimen . . . " Adv. Meter., V. 13(6) Mar. 16, 2001 pp. 371-376.

Parker et al. "Photonic Crystals" Aug. 2000 http://physicsweb.org/article/world/13/8/9/1.

Wang et al. "Direct nanoimprint of submicron . . . " Appl. Phys. Let. V. 75(18) (Nov. 1, 1999) pp. 2767-2769.

Vlasov et al."Synthesis of Photonic Crystals for Optical . . . " Adv. Mater, V. 11(2) (1999) pp. 165-169.

Cheng et at. "Controlled growth of hard-sphere colloidal . . . " Nature, V. 401 (Oct. 28, 1999) pp. 893-895.

Jiang et al. "Single Crystal Colloidal Multilayers . . . " Chem. Mater., V. 11(Jul. 15, 1999), pp. 2132-2140.

Van Blaaderen et al. "Template-directed colloidal crystalliz . . . " Nature V. 385 (Jan. 23, 1997) pp. 321-324.

Astratov et al. "Photonic band gaps in 3D ordered . . . " Phys. Let. A, V. 222 (Nov. 11, 1996) pp. 349-353.

Chou et al. "Imprint Lithography with 25-Nanometer . . . " Science V. 272 (5258) (Apr. 5, 1996) pp. 85-87.

Chou et al. "Imprint of sub-25 nm vias . . . " Appl. Phys. Let. V. 67(21) (Nov. 20, 1995) pp. 3114-3116.

McGurn et al."Photonic band structures of two- . . . " Phys. Rev. B V. 48(23) Dec. 15, 1993. pp. 17576-17579.

Yablonovitch et al. "Photonic Band Structure: . . . " Phys. Rev. Let. V. 67(17) Oct. 21, 1991 pp. 2295-2298.

Ho et al. "Existence of a Photonic Gap . . . " Phys. Rev. Let. V. 65(25) (Dec. 17, 1990) pp. 3152-3155.

Kuramochi et al, "Drilled alternating-layer structure for three-dimensional photonic . . . ", Jrnl or Vac Sci & Tech, Nov. 2000.

Intl Search Report for Patent Application # PCT/US2004/041861, filed Dec. 14, 2004. Search completed on May 31, 2005.

* cited by examiner

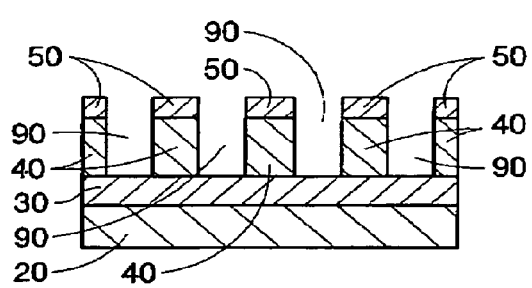
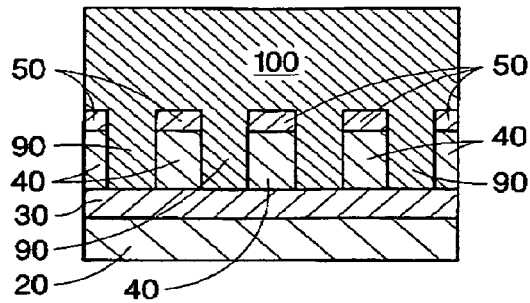
Fig. 2G       Fig. 2H
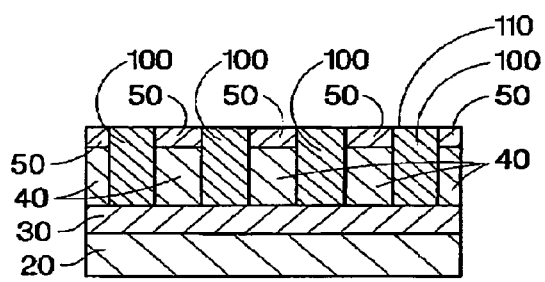
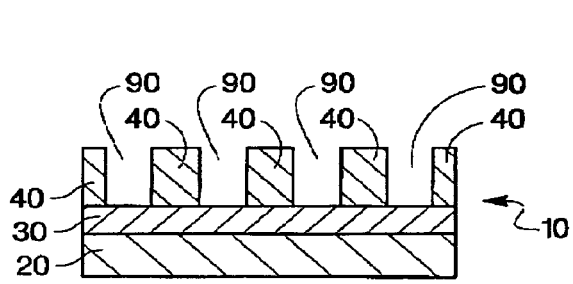
Fig. 2I       Fig. 2J
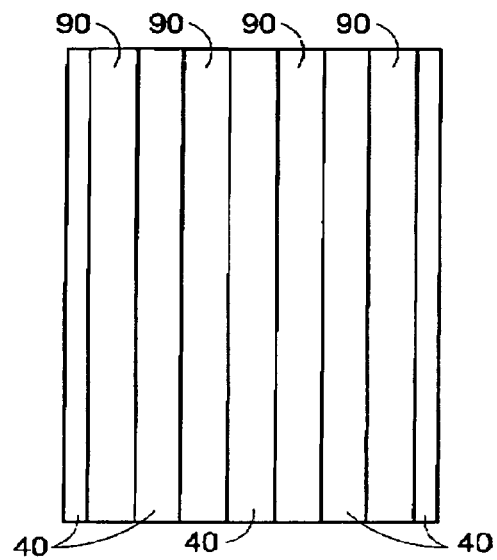
Fig. 3

PHOTONIC STRUCTURES, DEVICES, AND METHODS

CROSS-REFERENCE TO RELATED APPLICATION

This application is a divisional of Ser. No. 10/755,955 filed Jan. 12, 2004, now U.S. Pat. No. 7,255,805 which is hereby incorporated by reference. This application is related to commonly assigned U.S. Pat. No. 7,153,360, the entire disclosure of which is incorporated herein by reference.

TECHNICAL FIELD

This invention relates to photonic structures such as photonic crystals and more particularly to methods for making such photonic structures.

BACKGROUND

Photonic crystals are spatially periodic structures having useful electromagnetic wave properties, such as photonic bandgaps. In principle, the spatial periodicity of a photonic crystal can be in one, two, or three dimensions. There is especially high interest in developing technology of artificial photonic crystals that are useful in new and improved functional photonic devices, especially for the infrared and visible-light portions of the electromagnetic spectrum. Functional devices using photonic crystals, such as selective reflectors, filters, optical couplers, resonant cavities, delay lines, and waveguides have been proposed and/or fabricated.

Several methods for forming artificial photonic crystals are known. Multilayered dielectric films have been used to make one-dimensional photonic crystals along the dimension perpendicular to the films.

Three-dimensional photonic crystals have been formed by stacking and bonding wafers in which periodic structures have been micro-machined by etching. Such methods result in structures called "wood-pile" or "picket-fence" structures because the stacked elements have an appearance similar to stacked square timbers. Such methods require precise alignment of the micro-machined wafers to be bonded together, which becomes more difficult as the number of layers increases and as the dimensions of micro-machined features are reduced.

Some of the known methods for forming artificial photonic crystals work by modifying the refractive index periodically in a material originally having a uniform refractive index. For example, light-wave interference or holography has been used to create periodic variations of refractive index within photosensitive materials, such as photoresist, to make photonic crystals. Perhaps the simplest methods for forming a one- or two-dimensional photonic crystal are those methods that form a periodic or quasi-periodic array of holes in a uniform slab of material. A vacuum or material filling the holes has a different index of refraction from the base material of the slab. In the background art, such holes have been formed by micro-machining or by nanoscale lithography, such as electron-beam or ion-beam lithography. Conversely, such charged-particle beam lithography has also been used to selectively assist deposition of material to form spaced elements of the photonic crystal.

Some photonic crystals have been formed by self-assembly of very small particles provided in a colloidal suspension. A colloidal suspension is used (e.g., in a Langmuir-Blodgett type of process) to form a periodic array of nano-particles (e.g., nano-spheres). This structure can then be backfilled using atomic-layer chemical vapor deposition (ALCVD), for example. The colloidal structure can be removed, thus forming an inverse opal structure.

Another approach has been to use substantially smaller nano particles along with the larger nanospheres in a suspension. As the material is dried in a sedimentation process, pressed and then sintered, a periodic structure is formed. The nanospheres can be removed, resulting in an inverse opal structure. Thus, when the colloidal particles themselves have been removed to leave an "inverse" photonic crystal, the crystal lattice positions are occupied by voids in a matrix.

In another example of a colloidal process, nanocrystals have been assembled from a colloidal suspension, concentrated as close-packed clusters in pores in a template (the pores being larger than the nanocrystals) to form a quantum-dot solid. In some cases, the interstitial spaces between the colloidal particles have been filled with a second material of a different refractive index.

While all of these methods and others have been used successfully to make small quantities of photonic crystals, more efficient and lower-cost methods for mass-production fabrication of photonic crystals are needed.

BRIEF DESCRIPTION OF THE DRAWINGS

The features and advantages of the disclosure will readily be appreciated by persons skilled in the art from the following detailed description when read in conjunction with the drawings, wherein:

FIGS. 2A-2J show a series of cross-sectional side elevations of structural embodiments at various stages of fabrication using a second embodiment of a method performed in accordance with the invention.

FIG. 3 is a top plan view of an embodiment of a photonic crystal made in accordance with the invention, corresponding to FIG. 2J.

DETAILED DESCRIPTION OF EMBODIMENTS

Figure 1:
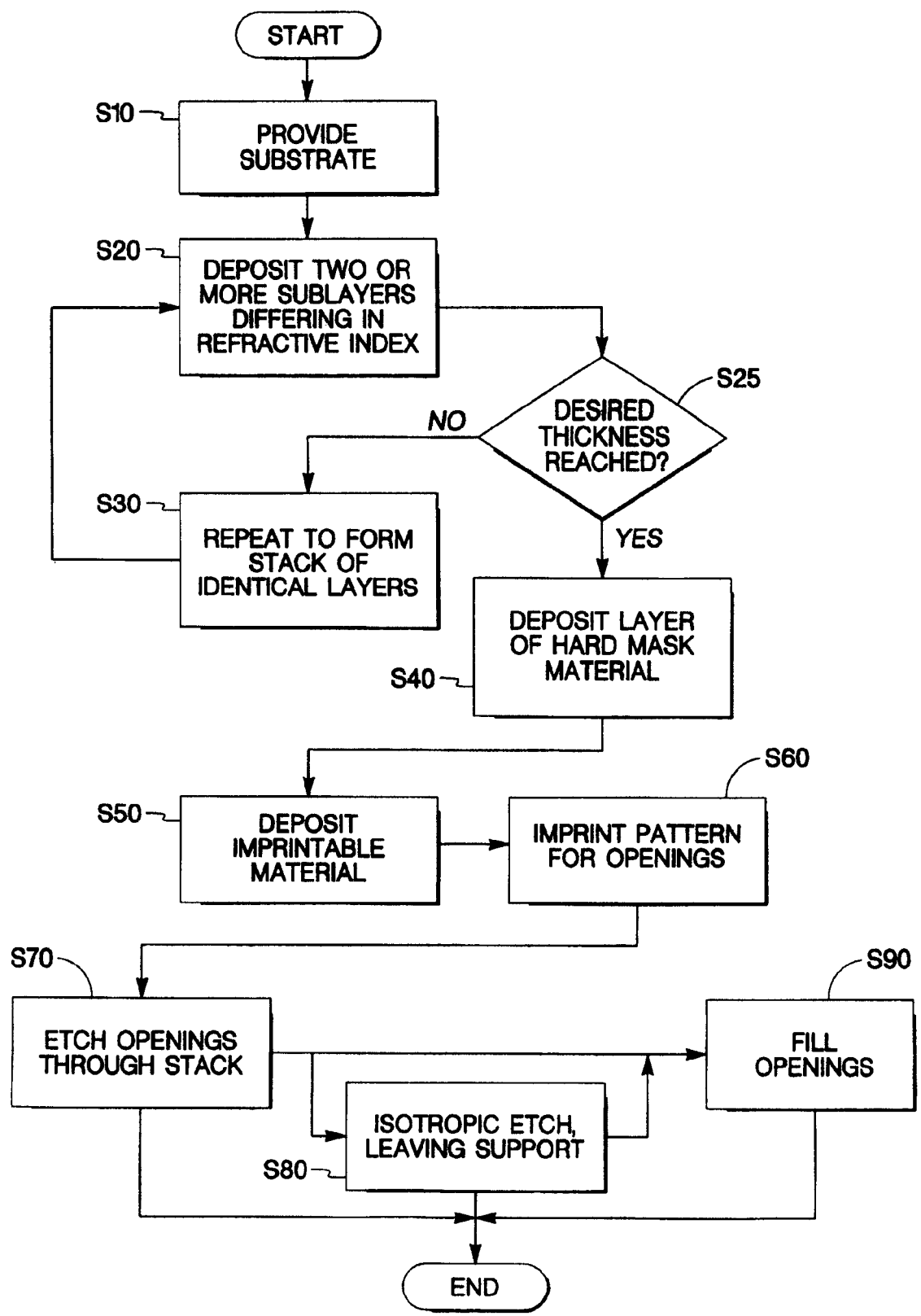
FIG. 1 is a flow chart illustrating a first embodiment of a method performed in accordance with the invention.

Throughout this description and the appended claims, the prefix "nano-" is used to refer to dimensions expressed in nanometers, i.e., dimensions less than about one micrometer. Nano-imprint lithography methods as used in the embodiments described herein are known to be capable of forming structures having minimum dimensions of less than about 25 nanometers as well as structures having larger dimensions. See, e.g., S. Y. Chou et al., "Imprint Lithography with 25-Nanometer Resolution," *Science*, Vol. 272, pp. 85-87 (Apr. 5, 1996) and U.S. Pat. No. 5,772,905 to S. Y. Chou, entitled "Nanoimprint Technology," issued on Jun. 30, 1998. The entire disclosure of each of these is incorporated herein by reference.

The drawings are not drawn to any uniform scale. In particular, vertical and horizontal scales may differ and may vary from one drawing to another. Method steps shown in the drawings are designated by reference numerals S10, . . . , S90.

One aspect of the invention is an embodiment of a method (shown in FIG. 1) for making a photonic structure, including the steps of providing a substrate (S10) and depositing (step S20) a planar layer comprising two or more sublayers having different sublayer refractive indices. If the desired thickness has not been reached (decision step S25), step S20 may be repeated a number of times to accumulate a number of planar layers to form a stack of planar layers (step S30). The planar layers of the stack may be substantially identical. The stack of planar layers may be characterized in part by the layer pitch, i.e., the distance from a point in one layer to the corresponding point in the next layer. Thus, the pitch is generally equal to the thickness of the planar layers.

A hard mask material is deposited (step S40) on the top surface of the stack, and an imprintable material is deposited over the hard mask material (step S50). The imprintable material is patterned (step S60) by imprinting an array of depressions. In step S70, a regular array of openings is directionally etched at the depressions, through the hard mask material and the stack, the openings extending through the stack thickness. If there are no intervening layers, the openings may extend to the substrate. An embodiment of a photonic crystal may be made by this method and/or by the variations described below, and an integrated-circuit embodiment may be made comprising the photonic crystal.

The substrate for many embodiments has a planar top surface comprising a substance such as silicon, silicon oxide, silicon nitride, germanium, glass, aluminum oxide, diamond, metal, metal oxide, metal nitride, and combinations of these materials. Zirconia ($ZrO_2$) is an example of a metal oxide that may be used. The planar layers of the stack include sublayers, which may also comprise these substances and/or their combinations. The embodiment examples described below may include alternate sublayers of polysilicon and a metal such as tungsten, or alternate layers of polyimide or other low-stress film and tungsten, for example. In another embodiment, the sublayers may consist of alternating sublayers of epitaxial silicon grown under differing epitaxy conditions to vary the refractive index systematically between alternate sublayers. For example, four to eight layers, each comprising two sublayers may form the stack. For such embodiments, the substrate may have a specific suitable crystallographic orientation, such as a (100) plane of silicon.

The hard mask material may be a thin layer of silicon dioxide, silicon nitride, or silicon oxynitride, for example. The imprintable material may comprise a polymer such as an ultraviolet (UV)-curable polymer, a thermoplastic polymer, a thermosetting polymer, a polyester, a polycarbonate, a photoresist, or polymethylmethacrylate (PMMA).

The step S70 of directionally etching openings through the hard mask and the stack may be performed by reactive ion etching (RIE). Specific reactive ion etching methods are known to those skilled in the art for many materials, including all the materials given as examples herein.

FIG. 1 also illustrates a variation of the method embodiment described above, in which a portion of a selected material is isotropically etched from the sublayers of the stack in step S80, while leaving a portion of the selected material un-etched for supporting the stack. Step S80 of isotropically etching a portion of the selected material may be performed by wet chemical etching, for example.

In step S90, the openings may be filled with a substance having a refractive index differing from the refractive index of at least one of the sublayers of the stack.

Those skilled in the art will recognize that the method, e.g., from step S20 to steps S70, S80, and/or S90, may be repeated a number of times to produce a photonic structure having any desired thickness, each repetition using the previous stack as a substrate.

The openings formed through the stack may be arranged in a substantially regular array, such as a rectangular array with the openings aligned in rows parallel to two orthogonal axes. The rows of openings may be spaced apart along at least one of the two orthogonal axes by a distance substantially equal to the layer pitch of the stack. Thus, the resulting photonic structure may have orthorhombic symmetry. In particular, the openings may be arranged in a square array, aligned and equally spaced in rows parallel to two orthogonal axes. Thus, the resulting photonic structure may have cubic symmetry. Other arrangements of the openings may result in hexagonal symmetry or other symmetries known in the art of crystallography.

Each sublayer has a sublayer thickness, resulting in the layer pitch described above, and the regular array of openings is characterized by at least one opening pitch. The sublayer thickness (resulting in the layer pitch) and the pitch of the openings cooperate such that the resultant photonic structure has desired optical properties, such as a desired photonic bandgap.

FIGS. 2A-2J show a series of cross-sectional side elevation views of structures at various stages of fabrication of an embodiment of a photonic crystal, made by a method embodiment that differs in details from the embodiment illustrated by FIG. 1. The initial substrate 20 may be a silicon wafer. Other embodiments may use other substrate materials such as glasses or plastics. Suitable low-temperature deposition processes and dry etching processes may be used with substrates that are not suitable for high temperatures and/or wet etching processes.

Figure 2A:
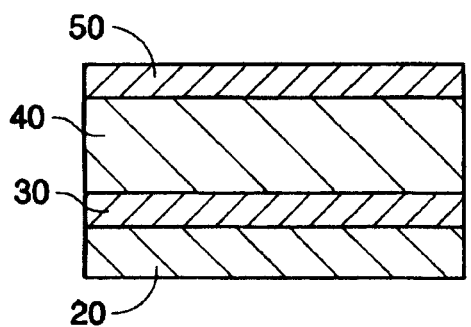

As shown in FIG. 2A, a silicon nitride layer 30 is deposited on the substrate, and a layer of polysilicon 40 is deposited over the silicon nitride layer 30. Materials other than polysilicon, which have various dielectric constants or refractive indices, may be incorporated instead of, or in addition to, polysilicon. An additional layer 50 of silicon nitride may be deposited over polysilicon layer 40 to provide a chemical mechanical polishing (CMP) stop.

Figure 2B:
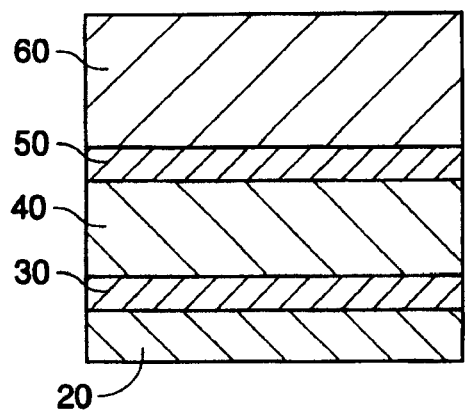
Figure 2C:
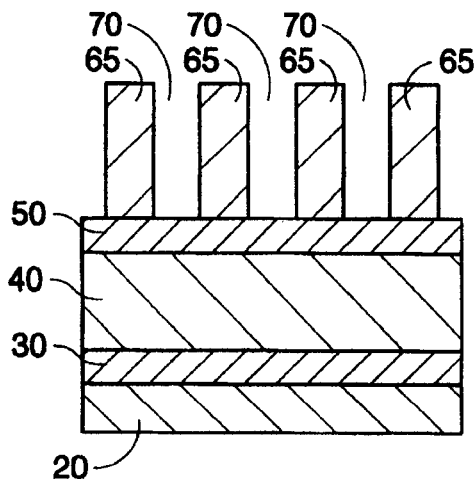
Figure 2D:
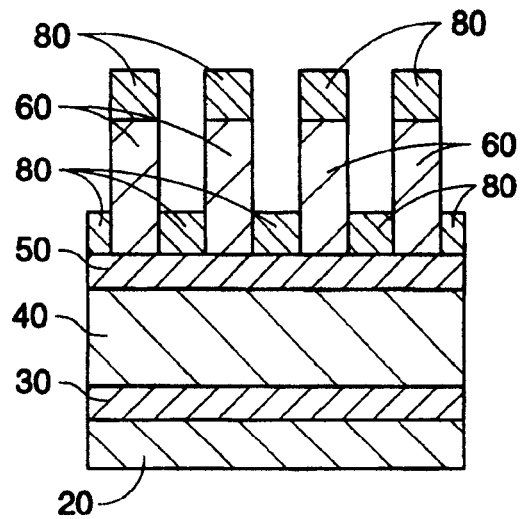
Figure 2E:
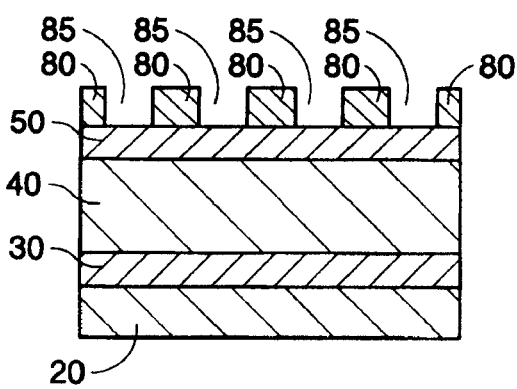
Figure 2F:
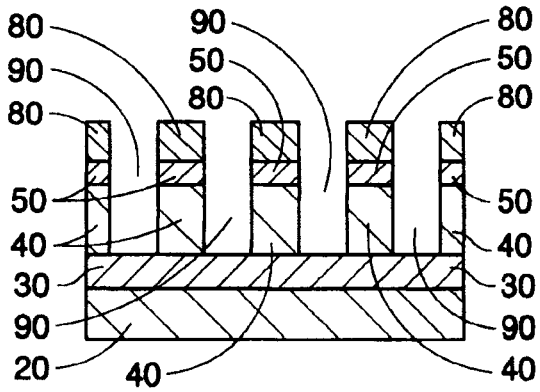

As shown in FIG. 2B, a layer of resist 60 (such as PMMA or other nano-imprint-lithography resist or a "step-and-flash" resist) is applied. As shown in FIG. 2C, a desired photonic crystal pattern is pressed into the resist 60, using nano-imprint lithography, stamping, or "step-and-flash" imprinting methods. After imprinting, RIE etching is used to remove resist residue, leaving patterned resist 65 with openings 70. As shown in FIG. 2D, a hard mask material 80 is deposited over the imprinted surface, i.e., over both the patterned resist 65 and openings 70. As shown in FIG. 2E, the resist is removed while leaving hard mask features 80 in place. FIG. 2F shows the result of etching the silicon nitride layer 50 and polysilicon layer 40 through the openings in hard mask 80, down to silicon nitride etch-stop layer 30, forming openings 90. As shown, hard mask 80 may also be removed by an etching process. FIG. 2G shows the photonic-crystal pattern with openings 90 separating features comprising polysilicon elements 40. As mentioned above, other materials may be substituted for polysilicon or may be used with polysilicon. In some embodiments, the photonic-crystal structure shown in FIG. 2G may be used as shown without further processing.

In other embodiments, as shown in FIG. 2H, a dielectric material 100 such as silicon dioxide is deposited, at least filling openings 90. The resulting surface is planarized, forming a planar top surface 110 at the top of silicon nitride layer 50, which acts as a stop (FIG. 2I). Silicon nitride layer 50 may be removed, providing a one-dimensional photonic-crystal structure 10. As shown in the one-dimensional photonic-crystal structure 10 of FIG. 2J, the silicon dioxide material 100 has been removed. Optionally, for some embodiments, the silicon dioxide material 100 may be left in place. Depending on the materials used, such a one-dimensional photonic-crystal structure (formed by using imprinted features) can be used for optical filters, waveguides, optical sensors, etc.

FIG. 3 shows a top view of the photonic-crystal structure 10 that is shown in cross-section in FIG. 2J.

If the application requires higher-dimensional photonic-crystal structures, the imprinting process outlined above can be repeated, producing complex two- and three-dimensional structures. Examples of two and three dimensional photonic crystals are illustrated in FIGS. 4, 5, and 6.

Figure 4:
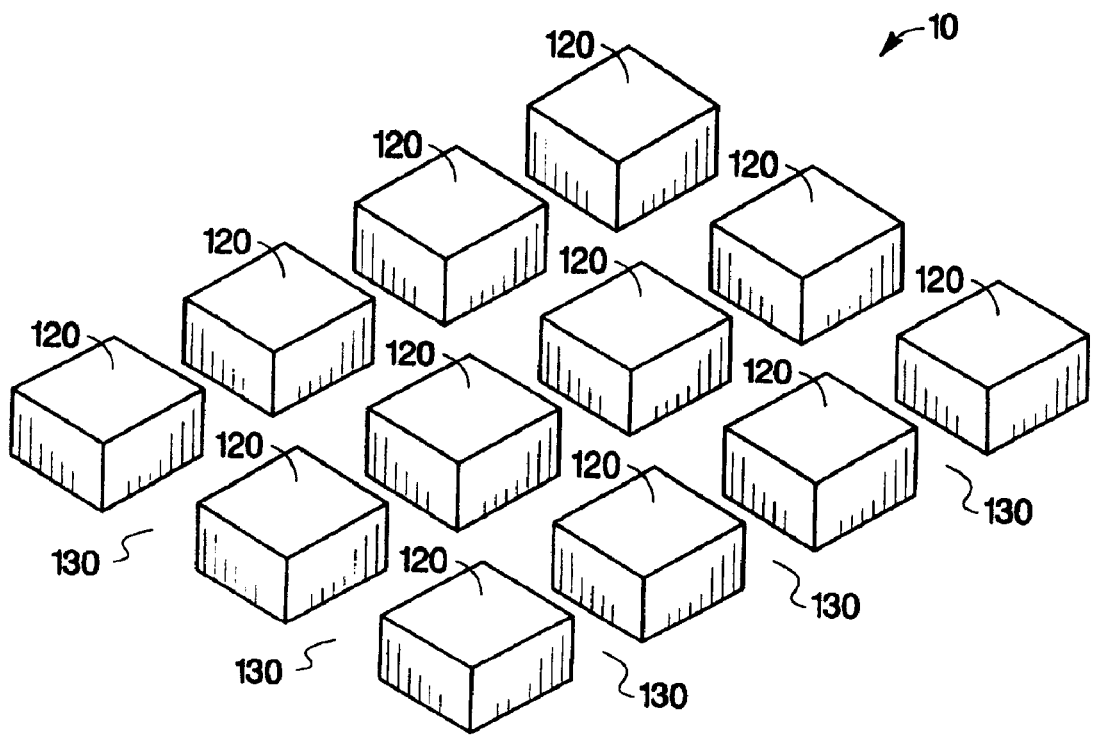
FIG. 4 is a perspective view of a first structural embodiment made in accordance with the invention.

FIG. 4 shows a simple two-dimensional photonic-crystal structure 10 in which the gaps 130 between the imprinted features 120 can contain vacuum, air, other gases, or other materials that have dielectric constants or refractive indices differing from those of the imprinted features.

Figure 5:
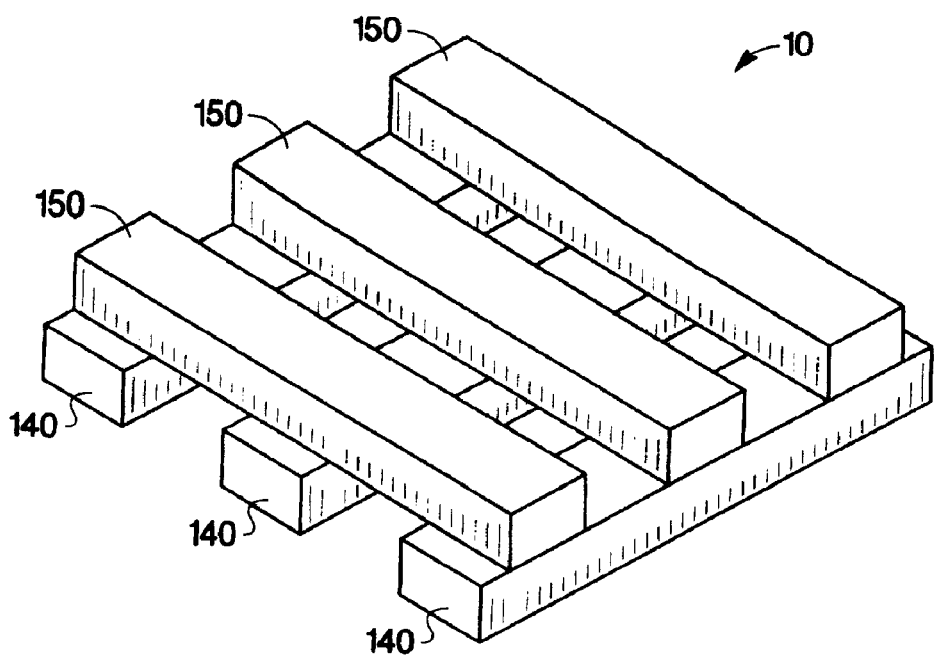
FIG. 5 is a perspective view of a second structural embodiment made in accordance with the invention.

FIG. 5 shows a "wood-pile" photonic-crystal structure 10 known in the art of photonic emitters. When made by methods of the present invention, elements 140 in a first crystallographic layer are formed in a first lithographic process, and elements 150 in a second crystallographic layer are formed in a similar second lithographic process, each layer requiring only one nano-imprint lithography step. The pattern made in the nano-imprint lithography of the second layer is oriented at an angle (e.g., about 90 degrees in FIG. 5) to the pattern made in the nano-imprint lithography of the first layer. While FIG. 5 shows only two layers, those skilled in the art will readily recognize that any number of such layers may be made, each suitably stacked over another.

Figure 6:
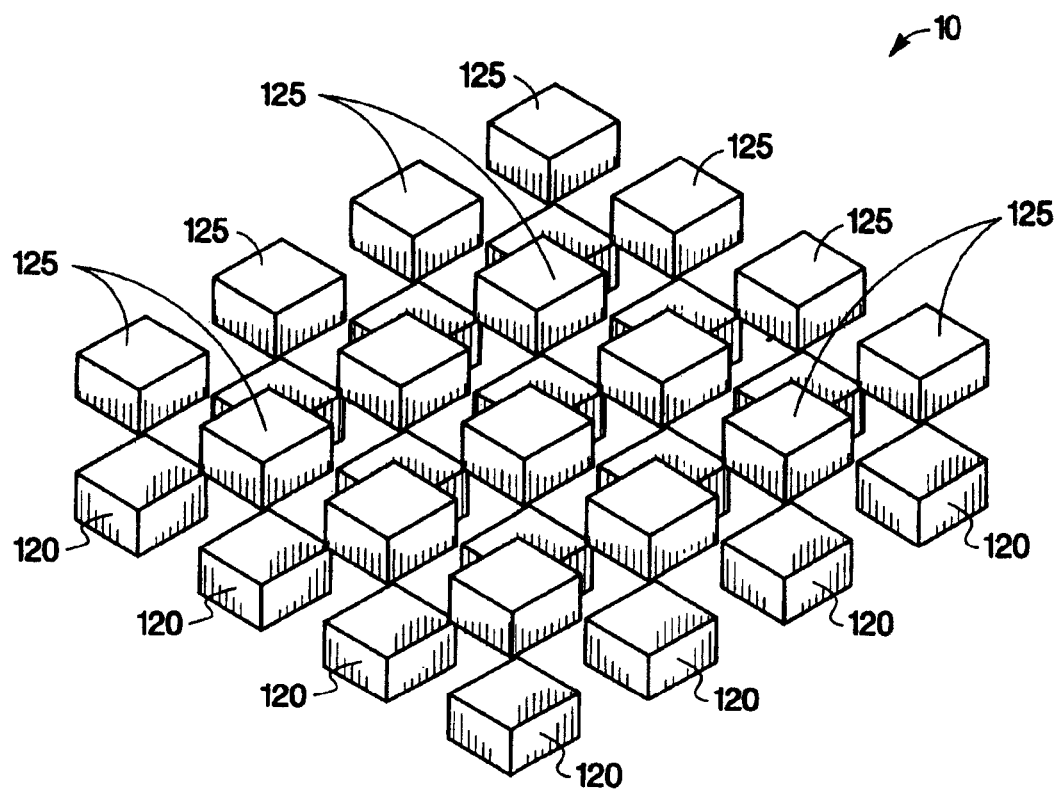
FIG. 6 is a perspective view of a third structural embodiment made in accordance with the invention.

FIG. 6 shows a more complex three-dimensional photonic-crystal structure 10 in which the periodicity of alternating layers may be varied layer to layer as desired. Thus, the periodicity of elements 120 in the lower layer shown in FIG. 6 may be made to differ from the periodicity of elements 125 in the upper layer. Again, while FIG. 6 shows only two layers, those skilled in the art will readily recognize that any number of such layers may be made, each suitably stacked over another, with a desired variation in periodicity. The periodicity of each layer in a stack may be made to differ from the periodicity of its adjacent layers. Thus, the periodicity or lattice parameter may be varied from one layer to another in any desired manner, e.g., continuously, discontinuously, monotonically increasing or decreasing, periodically, etc., for various purposes.

Figure 7:
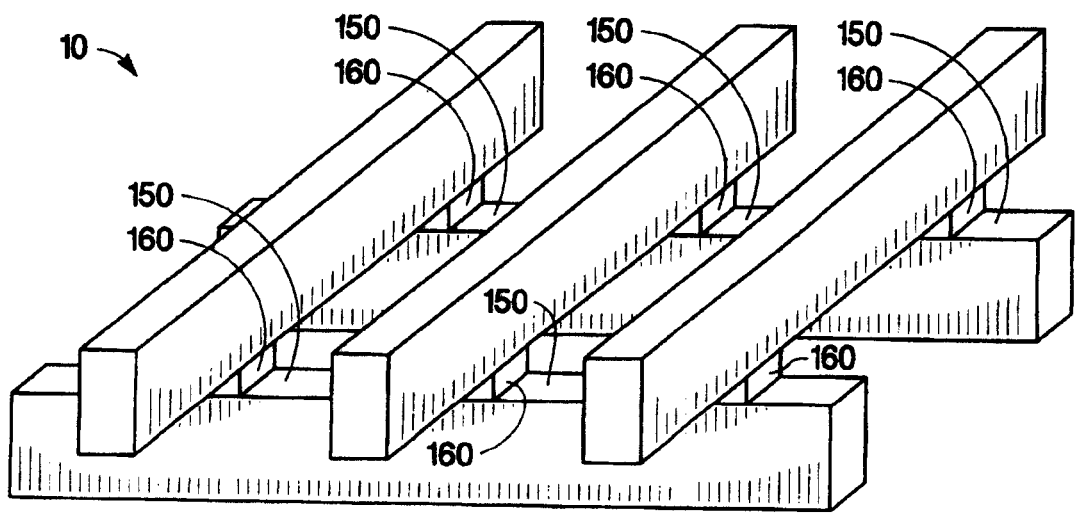
FIG. 7 is a perspective view of a fourth structural embodiment made in accordance with the invention.

FIG. 7 shows a structural variation achievable using methods of the present invention. As described above with reference to process step S80 (FIG. 1), an etch process may be used to remove material from regions 150, leaving support posts 160.

Thus, a wide variety of crystal structures and feature dimensions may be patterned and fabricated using the methods of the invention. Various crystallographic structures may be created, such as simple cubic, closed-packed cubic, wurtzite, zinc blende (sphalerite), diamond, and hybrid mixtures of crystallographic structures having various symmetries.

INDUSTRIAL APPLICABILITY

Methods of the present invention and the photonic crystals made by these methods are useful for manipulating and controlling propagation of electromagnetic waves. The structures may be used in optical integrated circuits, photonic circuits incorporating such integrated circuits, and many other applications. The methods are suitable for mass-production fabrication of photonic crystals, at relatively low cost, due to the simplicity of the fabrication method and the need for only one nano-imprint lithography step for a one- or two-dimensional crystal, for some three-dimensional crystals, or for each layer of a multi-dimensional crystal.

Although the foregoing has been a description and illustration of specific embodiments of the invention, various modifications and changes thereto can be made by persons skilled in the art without departing from the scope and spirit of the invention as defined by the following claims. For example, the order of steps may be varied for some applications. Various functionally equivalent materials may be substituted for materials used as examples in this description. Also, for example, successive repetitions of the fabrication method to produce a photonic structure of arbitrarily large thickness may use uniform layer thicknesses or may vary the layer thicknesses in any desired manner, e.g., to form a superlattice in the vertical direction.

What is claimed is:

1. A method for making a photonic periodic structure, the method comprising the steps of:
   a) providing a substrate;
   b) depositing at least one planar layer comprising two or more sublayers having different sublayer refractive indices;
   c) depositing a chemical-mechanical-polishing (CMP) stop layer;
   d) depositing a resist layer;
   e) patterning the resist layer by nano-imprint lithography to impress recesses into the resist layer in accordance with a desired periodicity;
   f) directionally etching to remove resist from the recesses in the resist layer, whereby first openings are formed in the resist layer;
   g) depositing a hard mask material over the resist layer and into the first openings;
   h) removing the resist, while leaving a periodic pattern of hard mask material only where previously deposited in the first openings;
   i) selectively etching through the at least one planar layer in accordance with the periodic pattern of hard mask material to form second openings, whereby the photonic periodic structure is formed.

2. The method of claim 1, further comprising the step of:
   j) depositing a dielectric material, at least filling the second openings and forming a surface.

3. The method of claim 2, wherein the dielectric material has a refractive index differing from the refractive indices of the sublayers of the at least one planar layer.

4. The method of claim 2, further comprising the step of:
   k) planarizing the surface formed.

5. The method of claim 1, further comprising: repeating a subset of steps a number of times until a desired total thickness is reached, the subset of steps comprising:
   b) depositing at least one planar layer comprising two or more sublayers having different sublayer refractive indices;
   c) depositing a chemical-mechanical-polishing (CMP) stop layer;
   d) depositing a resist layer;
   e) patterning the resist layer by nano-imprint lithography to impress recesses into the resist layer in accordance with a desired periodicity;
   f) directionally etching to remove resist from the recesses in the resist layer, whereby first openings are formed in the resist layer;

g) depositing a hard mask material over the resist layer and into the first openings;

h) removing the resist, while leaving a periodic pattern of hard mask material only where previously deposited in the first openings;

i) selectively etching through the at least one planar layer in accordance with the periodic pattern of hard mask material to form second openings, whereby the photonic periodic structure is formed.

* * * * *

UNITED STATES PATENT AND TRADEMARK OFFICE
CERTIFICATE OF CORRECTION

PATENT NO. : 7,608,194 B2  Page 1 of 1
APPLICATION NO. : 11/774397
DATED : October 27, 2009
INVENTOR(S) : James Stasiak et al.

It is certified that error appears in the above-identified patent and that said Letters Patent is hereby corrected as shown below:

On the title page, item (75), in column 1, Inventors, line 1, delete "Lebonon," and insert -- Lebanon, --, therefor.

On the title page, item (75), in column 1, Inventors, line 2, delete "Lebonon," and insert -- Lebanon, --, therefor.

Signed and Sealed this

Second Day of February, 2010

David J. Kappos
*Director of the United States Patent and Trademark Office*